(12) United States Patent
Kaneyama et al.

(10) Patent No.: US 6,452,214 B2
(45) Date of Patent: *Sep. 17, 2002

(54) GROUP III NITRIDE COMPOUND SEMICONDUCTOR LIGHT-EMITTING DEVICE HAVING A LIGHT EMISSION OUTPUT OF HIGH LIGHT INTENSITY

(75) Inventors: Naoki Kaneyama, Inazawa; Makoto Asai, Ama-gun; Katsuhisa Sawazaki, Nishikasugai-gun, all of (JP)

(73) Assignee: Toyoda Gosei Co., Ltd., Aichi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/523,463

(22) Filed: Mar. 10, 2000

(30) Foreign Application Priority Data

Mar. 31, 1999 (JP) ............................................. 11-090718

(51) Int. Cl.[7] ............................................... H01L 33/00
(52) U.S. Cl. ........................................................... 257/79
(58) Field of Search ........................... 257/94, 96, 101, 257/103, 79

(56) References Cited

U.S. PATENT DOCUMENTS

| 5,432,808 A | | 7/1995 | Hatano et al. ................. 372/45 |
| 5,592,501 A | * | 1/1997 | Edmond et al. ............... 372/45 |
| 5,751,752 A | * | 5/1998 | Shakuda ........................ 372/45 |
| 6,031,858 A | | 2/2000 | Hatakoshi et al. ............ 372/46 |

FOREIGN PATENT DOCUMENTS

| EP | 0716457 | 6/1996 |
| JP | 09219541 | 2/1997 |
| JP | 10-242587 | 9/1998 |
| WO | WO 97/48138 | 12/1997 |

* cited by examiner

Primary Examiner—Nathan J. Flynn
Assistant Examiner—Leonardo Andújar
(74) Attorney, Agent, or Firm—Pillsbury Winthrop LLP

(57) ABSTRACT

A cap layer of GaN about 140 Å thick and a p-type clad layer of Mg-doped p-type $Al_xGa_{1-x}N$ (x=0.12) about 200 Å thick are formed successively on an MQW active layer about 230 Å thick. A p-type contact layer of Mg-doped p-type $Al_yGa_{1-y}N$ (y=0.05) about 600 Å thick is further formed thereon. These composition ratios $x$ and $y$ are selected to satisfy the expression "$0.03 \leq 0.3x \leq y \leq 0.5x \leq 0.08$", so that the composition of the p-type contact layer becomes close to the composition of the p-type clad layer.

6 Claims, 3 Drawing Sheets

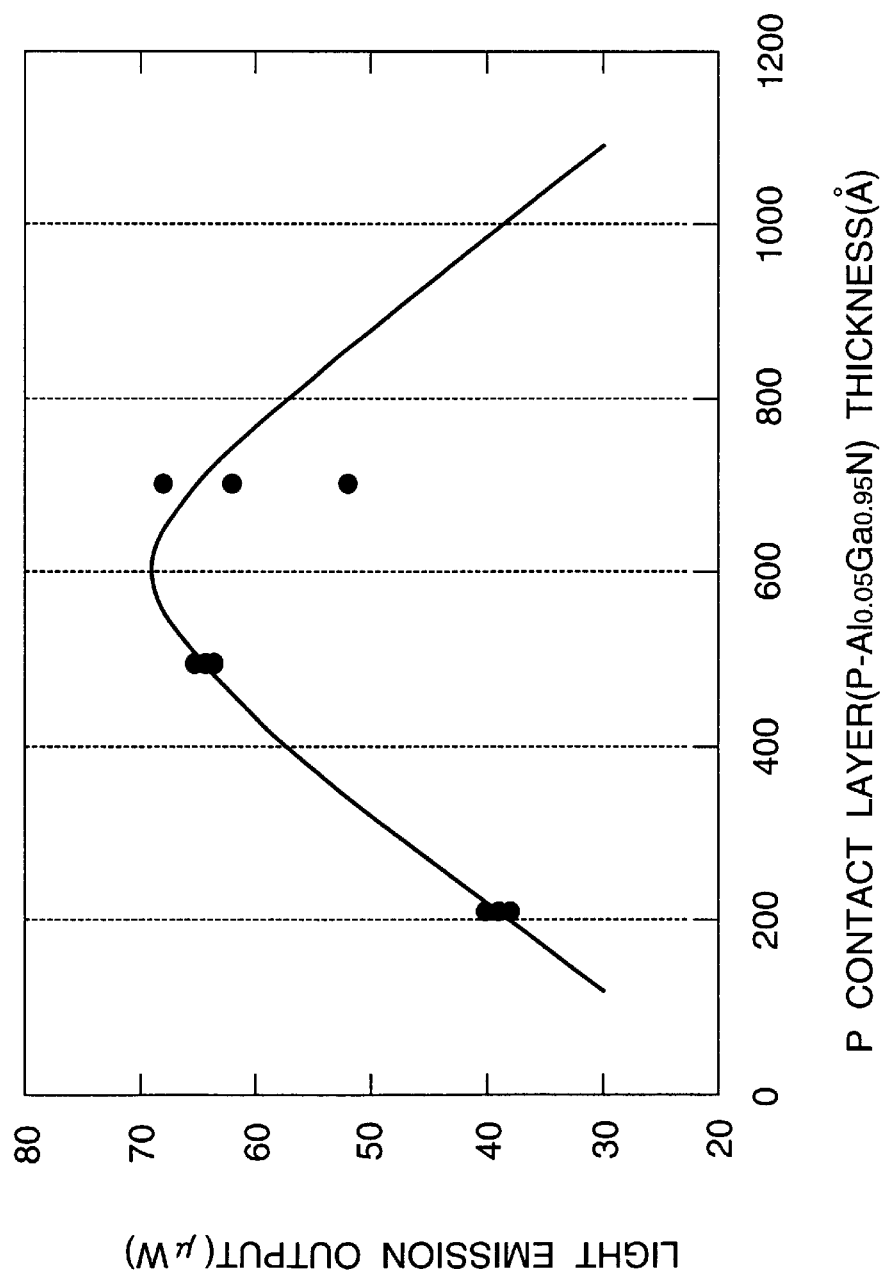

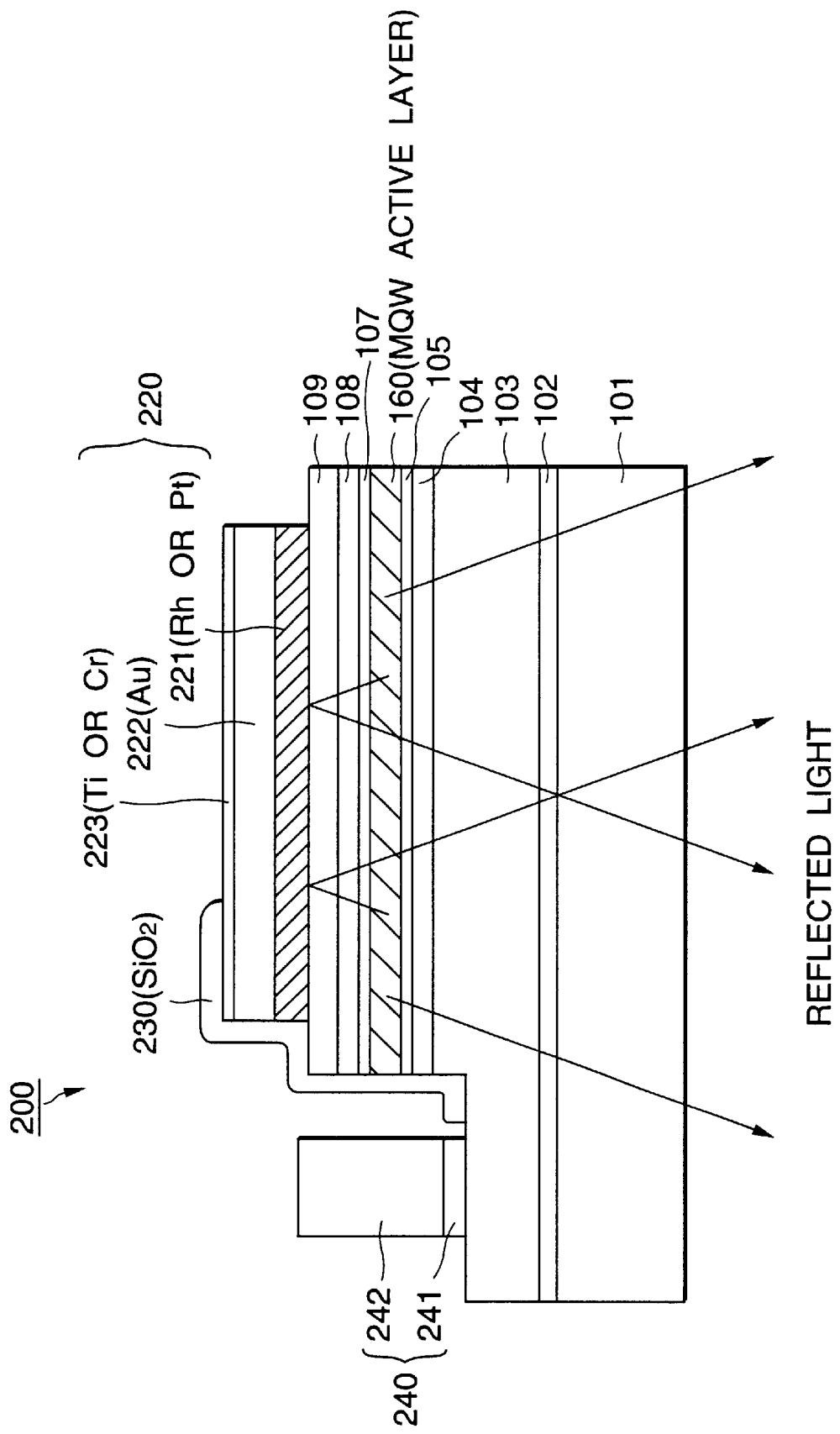

GROUP III NITRIDE COMPOUND SEMICONDUCTOR LIGHT-EMITTING DEVICE HAVING A LIGHT EMISSION OUTPUT OF HIGH LIGHT INTENSITY

BACKGROUND OF THE INVENTION

1. Field of the Invention

The present invention relates to a group III nitride compound semiconductor light-emitting device having a light emission output of high light intensity.

The present application is based on Japanese Patent Application No. Hei. 11-090718, which is incorporated herein by reference.

2. Description of the Related Art

A device of a double heterostructure for emitting green or blue light is known as a light-emitting device comprising layers of group III nitride compound semiconductors laminated on a substrate. For example, a light-emitting device with a p-type clad layer made of $Al_xGa_{1-x}N$ (0<x<1) is generally known. In this type light-emitting devices, a p-type contact layer was generally heretofore made of gallium nitride (GaN).

When a p-type contact layer made of gallium nitride (GaN) was grown on a p-type clad layer made of $Al_xGa_{1-x}N$ (0<x<1), the difference both in layer thermal expansion coefficient and in crystal lattice constant between the p-type clad layer and the p-type contact layer increased as the value of the composition ratio $x$ increased.

If the difference in crystal lattice constant between the two layers became large, the p-type contact layer was hardly grown as a layer of good quality. This caused reduction in intensity of emitted light.

On the other hand, if the difference in thermal expansion coefficient between the two layers became large, distortion due to the difference in thermal expansion coefficient was caused in an epitaxial wafer when the temperature was decreased from a high temperature to a room temperature after crystal growth. As a result, stress remained in the epitaxial wafer, so that this caused reduction in intensity of emitted light.

SUMMARY OF THE INVENTION

The present invention is designed to solve the aforementioned problem and an object thereof is to provide a light-emitting device of high light intensity by eliminating the disadvantage caused by the difference both in thermal expansion coefficient and in lattice constant between the aforementioned two layers.

The following means are effective for solving the problem.

That is, as a first means, there is provided a semiconductor light-emitting device comprising layers of group III nitride compound semiconductors laminated on a substrate, and a p-type clad layer of $Al_xGa_{1-x}N$ (0<x<1), is in that the device further comprises a p-type contact layer made of $Al_yGa_{1-y}N$ (0<y<x) which is lower in the composition ratio of aluminum (Al) than the p-type clad layer.

As a second means, preferably, in the first means, the p-type contact layer is made of $Al_yGa_{1-y}N$ (0.1x≦y≦0.7x). More preferably, the value of the composition ratio $y$ of aluminum (Al) in the p-type contact layer is approximately in the range "0.4x≦y≦0.5x".

As a third means, preferably, in first means, the p-type contact layer is made of $Al_yGa_{1-y}N$ (0.01≦y≦0.12). More preferably, the absolute value of the composition ratio $y$ of aluminum (Al) in the p-type contact layer is approximately in the range "0.03≦y≦0.08".

As a fourth means, preferably, in any one of the first, second and third means, the thickness of the p-type contact layer is selected to be in a range of from 200 Å to 1000 Å both inclusively. More preferably, the thickness of the p-type contact layer is selected to be in a range of from 500 Å to 800 Å both inclusively.

The aforementioned problem can be solved by the above means.

Incidentally, the group III nitride compound semiconductors according to the present invention are represented by the general formula $Al_xGa_yIn_{1-x-y}N$ (0≦x≦1, 0≦y≦1, 0≦x+y≦1), which may further contain group III elements such as boron (B) and thallium (Tl) and in which the nitrogen (N) may be partially replaced by phosphorus (P), arsenic (As), antimony (Sb) or bismuth (Bi).

Accordingly, each of layers such as a buffer layer, a barrier layer, a well layer, a clad layer, a contact layer, an intermediate layer, a cap layer, etc. in the group III nitride compound semiconductor light-emitting device may be made of quaternary, ternary or binary $Al_xGa_yIn_{1-x-y}N$ (0≦x≦1, 0≦y≦1, 0≦x+y≦1), such as AlGaN, InGaN, or the like, of an optional crystal mixture ratio.

Further, a metal nitride compound such as titanium nitride (TiN), hafnium nitride (HfN), or the like, or a metal oxide compound such as zinc oxide (ZnO), magnesium oxide (MgO), manganese oxide (MnO), or the like, other than the aforementioned group III nitride compound semiconductor may be used as the buffer layer.

Further, a group II element such as beryllium (Be), zinc (Zn), or the like, other than magnesium (Mg) may be used as the p-type impurities.

Further, the n-type semiconductor layer may be formed by doping the aforementioned group III nitride compound semiconductor with a group IV element such as silicon (Si), germanium (Ge), or the like, or with a group VI element.

Further, silicon carbide (SiC), zinc oxide (ZnO), magnesium oxide (Mgo), manganese oxide (MnO), or the like, other than sapphire may be used as the substrate for crystal growth.

According to the means of the present invention, the composition of the p-type contact layer becomes close to that of the p-type clad layer. Hence, the difference in crystal lattice constant between the two layers is reduced, so that the p-type contact layer of good quality can be grown. Hence, the intensity of light emitted from the light-emitting device is improved.

According to the means of the present invention, the difference in thermal expansion coefficient between the two layers is reduced as well. Hence, stress remaining in the epitaxial wafer is reduced, so that the intensity of emitted light is improved.

When a p-type contact layer of $Al_yGa_{1-y}N$ (0<y<x), which is lower in the composition ratio of aluminum (Al) than a p-type clad layer of $Al_xGa_{1-x}N$ (0<x<1), is grown on the p-type clad layer, the value of the composition ratio $y$ of aluminum (Al) is selected to be preferably approximately in the range "0.1x≦y≦0.7x", more preferably in the range "0.4x≦y≦0.5x". If the value of the composition ratio $y$ in the p-type contact layer is too large, contact resistance between the positive electrode and the p-type contact layer increases, undesirably resulting in an increase in the drive voltage of the light-emitting device. If the value of the composition ratio y is too small, it is difficult to obtain the aforementioned operation and effect of the present invention because the composition of the p-type contact layer is not close to that of the p-type clad layer.

For the same reason as described above, the absolute value of the composition ratio y of aluminum (Al) in the p-type contact layer is also selected to be preferably approximately in the range "$0.01 \leq y \leq 0.12$", more preferably in the range "$0.03 \leq y \leq 0.08$". More in detail, the group III nitride compound semiconductor light-emitting device exhibits the highest intensity of emitted light particularly when the absolute value of the composition ratio y is about 0.05.

Though will be described later in detail, there is a strong correlation between the light emission output of the light-emitting device and the thickness of the p-type contact layer as shown in FIG. 2. Hence, the thickness of the p-type contact layer is preferably in a range of from 200 Å to 1000 Å both inclusively. More preferably, the thickness of the p-type contact layer is in a range of from 500 Å to 800 Å both inclusively. When the thickness of the p-type contact layer is in this range, the light emission output of the light-emitting device exhibits a large value. Further, the group III nitride compound semiconductor light-emitting device according to the present invention exhibits the highest intensity of emitted light particularly when the thickness of the p-type contact layer is about 600 Å.

Features and advantages of the invention will be evident from the following detailed description of the preferred embodiments described in conjunction with the attached drawings.

BRIEF DESCRIPTION OF THE DRAWINGS

In the accompanying drawings:

FIG. 2 is a graph showing a correlation between the light emission output of the light-emitting device according to the present invention and the thickness of a p-type contact layer; and FIG. 3 is a typical sectional view of a flip chip type group III nitride compound semiconductor light-emitting device 200 according to the present invention.

DETAILED DESCRIPTION OF THE PREFERRED EMBODIMENTS

Figure 1:
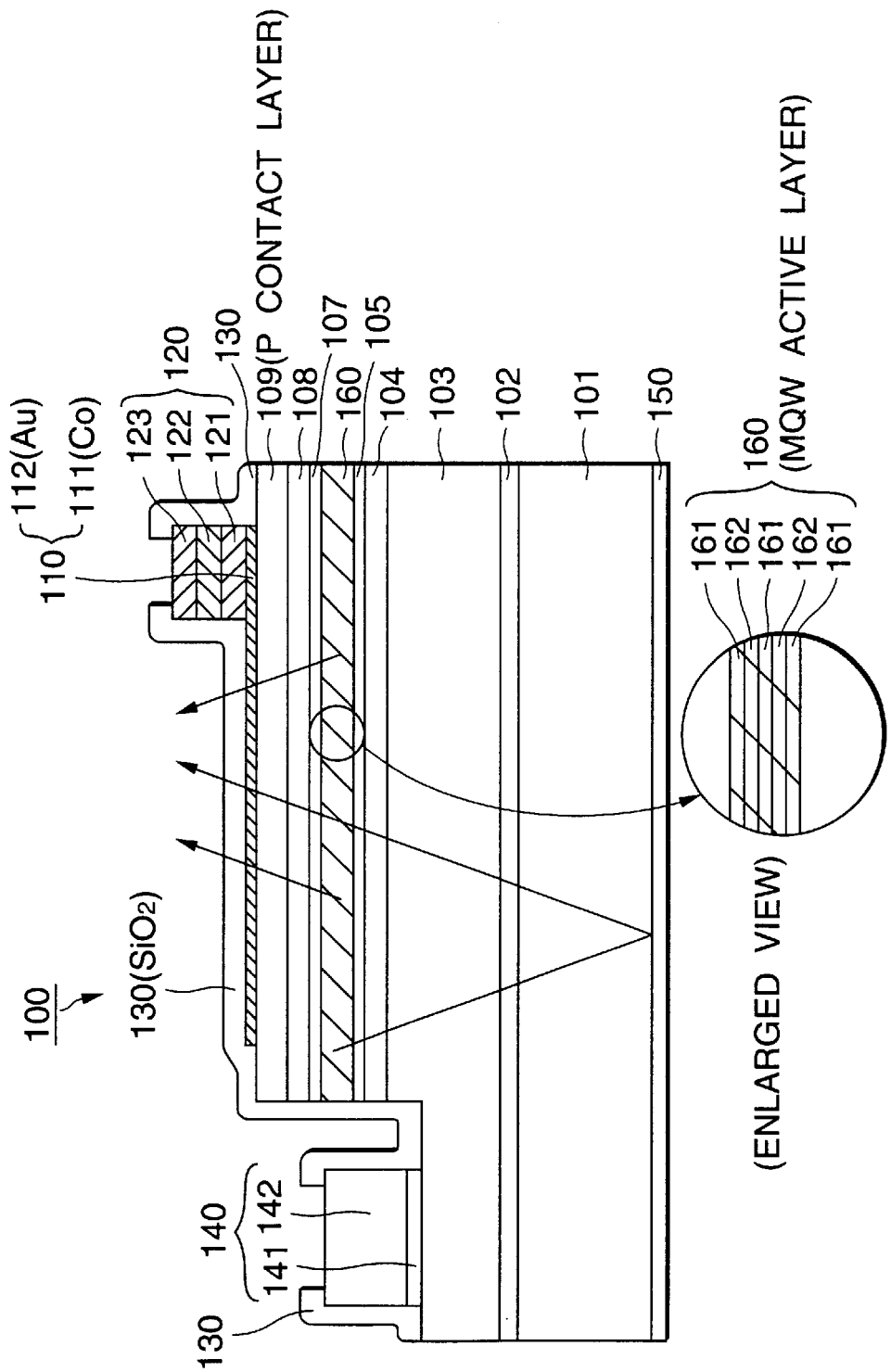
FIG. 1 is a typical sectional view of a wire bonding type group III nitride compound semiconductor light-emitting device 100 according to the present invention.

The present invention will be described hereunder on the basis of specific embodiments thereof.
(First Embodiment)

FIG. 1 is a sectional view showing a wire bonding type semiconductor light-emitting device 100 according to the present invention. A buffer layer 102 of aluminum nitride (AlN) about 200 Å thick is provided on a sapphire substrate 101. An n$^+$ layer 103 of a high carrier density, which is made of GaN doped with silicon (Si) and which is about 4.0 μm thick, is formed on the buffer layer 102.

An intermediate layer 104 of non-doped $In_{0.03}Ga_{0.97}N$ about 2000 Å thick is formed on the high carrier density n$^+$ layer 103.

An n-type clad layer 105 of GaN about 150 Å thick is further laminated on the intermediate layer 104. An MQW active layer 160 of a multilayer quantum well (MQW) structure, which is formed by alternately laminating well layers 161 of $Ga_{0.8}In_{0.2}N$ about 30 Å thick each and barrier layers 162 of GaN about 70 Å thick each, is further formed on the n-type clad layer 105. That is, three well layers 161 and two barrier layers 162 are laminated alternately to thereby form an MQW structure which has a film thickness of about 230 Å and which is composed of five layers in total with two cycles.

A cap layer 107 of GaN about 140 Å thick and a p-type clad layer 108 of p-type $Al_{0.12}Ga_{0.88}N$ about 200 Å thick are formed successively on the MQW active layer 160. A p-type contact layer 109 of p-type $Al_{0.05}Ga_{0.95}N$ about 600 Å thick is further formed on the p-type clad layer 108.

Further, a light-transmissible thin-film positive electrode 110 is formed on the p-type contact layer 109 by metal evaporation whereas a negative electrode 140 is formed on the n$^+$ layer 103. The light-transmissible thin-film positive electrode 110 is composed of a thin-film positive electrode first layer 111 of cobalt (Co) about 15 Å thick joined to the p-type contact layer 109, and a thin-film positive electrode second layer 112 of gold (Au) about 60 Å thick joined to the Co.

A thick-film positive electrode 120 is formed by successively laminating a thick-film electrode first layer 121 of vanadium (V) about 175 Å thick, a thick-film electrode second layer 122 of gold (Au) about 15000 Å thick and a thick-film electrode third layer 123 of aluminum (Al) about 100 Å thick on the light-transmissible thin-film positive electrode 110. The negative electrode 140 of a multilayer structure is formed by successively laminating a vanadium (V) layer 141 about 175 Å thick and an aluminum (Al) layer 142 about 1.8 μm thick on a partly exposed portion of the high carrier density n$^+$ layer 103.

Further, a protective film 130 constituted by an $SiO_2$ film is formed as the uppermost portion. Further, a reflection metal layer 150 of aluminum about 5000 Å thick is formed as the opposite lowermost portion on the bottom surface of the sapphire substrate 101 by metal evaporation.

A method for producing the light-emitting device 100 will be described below.

The aforementioned light-emitting device 100 was produced by vapor phase growth according to a metal organic vapor phase epitaxy method (MOVPE method). The gasses used were ammonia ($NH_3$), carrier gas ($H_2$, $N_2$), trimethylgallium ($Ga(CH_3)_3$) (hereinafter referred to as "TMG"), trimethylaluminum ($Al(CH_3)_3$) (hereinafter referred to as "TMA"), trimethylindium ($In(CH_3)_3$) (hereinafter referred to as "TMI"), silane ($SiH_4$), and cyclopentadienylmagnesium ($Mg(C_5H_5)_2$) (hereinafter referred to as "$CP_2Mg$").

First, a single-crystal sapphire substrate 101 having a face a cleaned by an organic cleaning process as a main face was attached to a susceptor placed in a reaction chamber of an MOVPE apparatus. Then, the substrate 101 was baked at a temperature of 1150° C. while $H_2$ was introduced into the reaction chamber under normal atmospheric pressure.

Then, a buffer layer 102 of AlN about 200 Å thick was formed by decreasing the temperature of the substrate 101 to 400° C. and by supplying $H_2$, $NH_3$ and TMA.

Then, a high carrier density n$^+$ layer 103, which was made of GaN doped with silicon (Si) and which had a film thickness of about 4.0 μm and an electron density of $2 \times 10^{18}/cm^3$, was formed by increasing the temperature of the substrate 101 to 1150° C. and by supplying $H_2$, $NH_3$, TMG, and silane.

Then, an intermediate layer 104 of $In_{0.03}Ga_{0.97}N$ about 2000 Å thick was formed by decreasing the temperature of the substrate 101 to 850° C. and by supplying either $N_2$ or $H_2$, $NH_3$, TMG and TMI.

After the intermediate layer 104 was formed, an n-type clad layer 105 of GaN about 150 Å thick was formed by keeping the temperature of the substrate 101 at 850° C. and by supplying either $N_2$ or $H_2$, $NH_3$ and TMG.

Then, a well layer 161 of $Ga_{0.8}In_{0.2}N$ about 30 Å thick was formed by supplying either $N_2$ or $H_2$, $NH_3$, TMG and TMI. Then, a barrier layer 162 of GaN about 70 Å thick was formed by supplying either $N_2$ or $H_2$, $NH_3$ and TMG.

Then, a well layer 161, a barrier layer 162 and a well layer 161 were further formed successively in the same condition as described above to thereby form an MQW active layer 160 about 230 Å thick with two cycles in total.

A cap layer 107 of GaN about 140 Å thick was further formed by supplying either $N_2$ or $H_2$, $NH_3$ and TMG.

Then, a p-type clad layer 108, which was made of p-type $Al_{0.12}Ga_{0.88}N$ doped with magnesium (Mg) and which was about 200 Å thick, was formed by keeping the temperature of the substrate 101 at 1150° C. and by supplying either $N_2$ or $H_2$, $NH_3$, TMG, TMA and $CP_2Mg$.

Then, a p-type contact layer 109, which was made of p-type $Al_{0.05}Ga_{0.95}N$ doped with magnesium (Mg) and which was about 600 Å thick, was formed by keeping the temperature of the substrate 101 at 1100° C. and by supplying either $N_2$ or $H_2$, $NH_3$, TMG, TMA and $CP_2Mg$.

Then, an etching mask was formed on the p-type contact layer 109. After a predetermined region of the mask was removed, the non-masked portion of the p-type contact layer 109, the p-type clad layer 108, the MQW active layer 160, the intermediate layer 104 and a part of the high carrier density n+ layer 103 were etched with a chlorine-containing gas by reactive ion etching to thereby expose a surface of the n+ layer 103.

Then, a negative electrode 140 to joined to the n+ layer 103 and a light-transmissible thin-film positive electrode 110 to be joined to the p-type contact layer 109 were formed by the following procedure.

(1) After evacuation to a high vacuum of the order of $10^{-4}$ Pa or less, a thin-film positive electrode first layer 111 of Co about 15 Å thick was formed on a surface evenly and a thin-film positive electrode second layer 112 of Au about 60 Å thick was further formed on the thin-film positive electrode first layer 111 of Co by an evaporation apparatus.

(2) Then, a photo resist was applied on a surface evenly and then the photo resist laminated on the p-type contact layer 109 except the light-transmissible thin-film positive electrode 110-forming portion was removed by photolithography.

(3) Then, both Co and Au exposed were removed by etching and then the photo resist was removed so that the light-transmissible thin-film positive electrode 110 was formed on the p-type contact layer 109.

(4) Then, a photo resist was applied and a window was formed in a predetermined region on the exposed surface of the n+ layer 103 by photolithography. After evacuation to a high vacuum of the order of $10^{-4}$ Pa or less, a vanadium (V) layer 141 about 175 Å thick and an aluminum (Al) layer 142 about 1.8 μm thick were formed successively by evaporation. Then, the photo resist was removed. As a result, the negative electrode 140 was formed on the exposed surface of the n+ layer 103.

(5) Then, a heating process for reducing contact resistance between the p-type contact layer 109 and the light-transmissible thin-film positive electrode 110 was carried out. That is, the atmosphere for the sample was evacuated by a vacuum pump and an $O_2$ gas was supplied to thereby set a pressure of 10 Pa. In this condition, heating was performed for about 4 minutes to keep the atmospheric temperature at about 570° C.

To form further a thick-film positive electrode 120 on the light-transmissible thin-film positive electrode 110 formed by the aforementioned process, a photo resist was applied evenly onto the light-transmissible thin-film positive electrode 110 and a window was formed in the thin-film positive electrode 120-forming portion of the photo resist. Then, a vanadium (V) layer 121 about 175 Å thick, a gold (Au) layer 122 about 15000 Å thick and an aluminum (Al) layer 123 about 100 Å thick were formed on the light-transmissible thin-film positive electrode 110 successively by evaporation. Thus, the thick-film positive electrode 120 was formed by a lift-off method in the same manner as in the step (4).

Then, a protective film 130 of $SiO_2$ was formed evenly on the upward exposed uppermost layer by electron beam evaporation, and a window was formed in each of portions of the protective film 130 on the thick-film positive electrode 120 and the negative electrode 140 by wet etching through the application of a photo resist and a photolithography process, so that the positive and negative electrodes 120 and 140 were exposed externally and the windows had their areas approximately equal to each other.

In this manner, the light-emitting device 100 was formed. Incidentally, the following expressions (1) and (2) hold for the p-type clad layer 108 of $Al_xGa_{1-x}N$ (0<x<1) and the p-type contact layer 109 of $Al_yGa_{1-y}N$ (0<y<x) in the light-emitting device 100.

$$y/x = 0.05/0.12 = 0.417 \quad (1)$$

$$0.1x \leq y \leq 0.7x \quad (2)$$

By forming the light-emitting device 100 as described above, the composition of the p-type contact layer was made relatively close to the composition of the p-type clad layer. Hence, the difference in crystal lattice constant between the two layers was reduced, so that the p-type contact layer of good quality was able to be grown. Hence, the intensity of light emitted from the light-emitting device was improved.

Another reason for improvement in the emitted light intensity of the light-emitting device 100 according to the present invention compared with the background art was that stress remaining in the light-emitting device was also reduced because the difference in thermal expansion coefficient between the two layers was relatively reduced.

Although the first embodiment has shown the case where the p-type contact layer 109 of $Al_yGa_{1-y}N$ (y=0.05<x) is grown on the p-type clad layer 108 of $Al_xGa_{1-x}N$ (x=0.12), the value of the composition ratio y of aluminum (Al) in the p-type contact layer 109 may be selected to be preferably approximately in the range "0.1x≦y<0.7x", more preferably approximately in the range "0.4x≦y<0.5x". If the value of the composition ratio y in the p-type contact layer is too large, contact resistance between the positive electrode and the p-type contact layer increases, undesirably resulting in increase in the drive voltage of the light-emitting device. If the value of the composition ratio y is contrariwise too small, it is difficult to obtain the aforementioned operation and effect because the composition of the p-type contact layer is not made close to the composition of the p-type clad layer.

The light-emitting device 100 in the first embodiment exhibits high light intensity because these conditions are satisfied sufficiently.

For the same reason as described above, the absolute value of the composition ratio y of aluminum (Al) in the p-type contact layer 109 is also selected to be preferably approximately in the range "0.01≦y≦0.12", more preferably approximately in the range "0.03≦y≦0.08".

FIG. 2 is a graph showing a correlation between the light emission output of the light-emitting device 100 according to the present invention and the thickness of the p-type contact layer 109. Because there is a strong correlation between the light emission output of the light-emitting device and the the thickness of the p-type contact layer as shown in FIG. 2, the thickness of the p-type contact layer is selected to be preferably in a range of from 200 Å to 1000 Å both inclusively, more preferably in a range of from 500 Å to 800 Å both inclusively. The light emission output of the light-emitting device exhibits a large value when the thickness of the p-type contact layer is in this range.

Generally in this type group III nitride compound semiconductor light-emitting devices, the original function of the p-type contact layer as a p-type low-resistance gallium nitride film containing a dopant for providing acceptors becomes insufficient to obtain a high light emission output if the p-type contact layer is too thin.

Or when the p-type contact layer 109 is formed or when a heating process such as annealing, or the like, is carried out after the formation of the p-type contact layer 109, solid solution may occur between the p-type contact layer 109 and the p-type clad layer 108 so that aluminum (Al) in the p-type clad layer 108 is eluted into the p-type contact layer 109. Hence, if the p-type contact layer 109 is too thin, not only is it impossible that the value of the composition ratio $y$ of aluminum (Al) in the p-type contact layer 109 is set to be in a desired range but also the light emission output of the light-emitting device varies largely.

If the p-type contact layer 109 is contrariwise too thick, strong stress is imposed on the p-type clad layer 108 and layers be low the p-type clad layer 108 because the thermal expansion coefficient of the p-type contact layer 109 is different from that of the p-type clad layer 108. If the p-type contact layer 109 is too thick, it is also difficult to form the p-type contact layer 109 as a desired good-quality crystal structure because dislocation due to lattice mismatching caused by the difference between crystal lattice constants occurs easily in the p-type contact layer 109.

It is undesirable from the point of view of quality that the p-type contact layer 109 is too thick, because both reduction in the intensity of emitted light and increase in individual variation of the intensity of light emitted from the light-emitting devices are brought by these actions.

It is also apparent from FIG. 2 that the light-emitting device 100 in the first embodiment can exhibit high light intensity because the thickness (600 Å) of the p-type contact layer 109 satisfies the aforementioned requirement sufficiently.

(Second Embodiment)

FIG. 3 is a typical sectional view showing a flip chip type semiconductor light-emitting device 200 according to the present invention. A buffer layer 102 of aluminum nitride (AlN) about 200 Å thick is provided on a sapphire substrate 101. An n+ layer 103 of a high carrier density, which is made of GaN doped with silicon (Si) and which is about 4.0 μm thick, is further formed on the buffer layer 102. An intermediate layer 104 of non-doped $In_{0.03}Ga_{0.97}N$ about 1800 Å thick is further formed on the n+ layer 103.

An n-type clad layer 105 and an MQW active layer 160, which is composed of GaN layers and $Ga_{0.8}In_{0.2}N$ layers, are further formed on the intermediate layer 104 successively in the same manner as in the light-emitting device 100 according to the first embodiment. A cap layer 107 of GaN about 140 Å thick and a p-type clad layer 108, which is made of $Al_{0.12}Ga_{0.88}N$ doped with magnesium (Mg) and which is about 200 Å thick, are formed on the MQW active layer 160 successively. A p-type contact layer 109 of Mg-doped $Al_{0.05}Ga_{0.95}N$ about 600 Å thick is further formed on the p-type clad layer 108.

Further, a multilayer thick-film electrode 220 is formed on the p-type contact layer 109 by metal evaporation whereas a negative electrode 240 is formed on the n+ layer 103. The multilayer thick-film electrode 220 has a three-layered structure consisting of a first metal layer 221 joined to the p-type contact layer 109, a second metal layer 222 formed on an upper face of the first metal layer 221, and a third metal layer 223 formed on an upper face of the second metal layer 222.

The first metal layer 221 is a metal layer of rhodium (Rh) or platinum (Pt) about 0.3 μm thick joined to the p-type contact layer 109. The second metal layer 222 is a metal layer of gold (Au) about 1.2 μm thick. The third metal layer 223 is a metal layer of titanium (Ti) about 30 Å thick.

The negative electrode 240 of a two-layered structure is formed by successively laminating a vanadium (V) layer 241 about 175 Å thick and an aluminum (Al) layer 242 about 1.8 μm thick on the partly exposed portion of the high carrier density n+ layer 103.

A protective film 230 constituted by an $SiO_2$ film is formed between the multilayer thick-film positive electrode 220 and the negative electrode 240 which are formed as described above. The protective layer 230 covers, from the n+ layer 103 exposed for forming the negative electrode 240, a side face of the MQW active layer 160, a side face of the p-type clad layer 108 and a side face of the p-type contact layer 109 and a part of the upper face of the p-type contact layer 109, which are exposed by etching, and further covers a side face of the first metal layer 221, a side face of the second metal layer 222 and a part of the upper face of the third metal layer 223. The third metal layer 223-covering portion of the protective film 230 constituted by an $SiO_2$ film is 0.5 μm thick.

As described above, a three-layered structure consisting of a first metal layer of rhodium (Rh) or platinum (Pt), a second metal layer of gold (Au), and a third metal layer of titanium (Ti) is applied to the multilayer thick-film positive electrode 220 in the flip chip type semiconductor light-emitting device 200.

Also when the semiconductor light-emitting device 200 is configured in the aforementioned manner, a semiconductor light-emitting device of higher light intensity than the background-art device can be achieved like the light-emitting device 100.

With respect to a group III nitride compound semiconductor light-emitting device such as the light-emitting device 100 or 200, or the like, for emitting green light in a main wavelength range of from 510 nm to 530 nm, experiment has shown that the device exhibits relatively high light intensity when the thickness of the p-type clad layer 108 is in a range of from 100 Å to 500 Å. More preferably, the thickness of the p-type clad layer 108 is in an optimum range of from 180 Å to 360 Å. When the thickness is in the optimum range, the highest light emission output can be obtained.

With respect to a group III nitride compound semiconductor light-emitting device according to the present invention for emitting blue light in a main wavelength range of from 460 nm to 475 nm, experiment has shown that the device exhibits relatively high light intensity when the thickness of the p-type clad layer 108 is in a range of from 70 Å to 390 Å. More preferably, the thickness of the p-type clad layer 108 is in an optimum range of from 90 Å to 300 Å. When the thickness is in the optimum range, the highest light emission output can be obtained.

On the other hand, the composition ratio $x$ of aluminum (Al) in the p-type clad layer 108 made of $Al_xGa_{1-x}N$ is preferably approximately in a range of from 0.10 to 0.14, more preferably in a range of from 0.12 to 0.13. If x is smaller than 0.10, the light emission output is lowered because it is difficult to confine carriers in the active layer. If x is larger than 0.14, the light emission output is also lowered because stress applied to the active layer increases in accordance with the difference between lattice constants of crystals.

Although the above embodiments have shown the case where the number of cycles in the MQW active layer 160 in each of the light-emitting devices 100 and 200 is two, the number of cycles is not particularly limited. That is, the present invention can be applied also to a group III nitride compound semiconductor light-emitting device having an active layer with any number of cycles or any structure.

Accordingly, for example, the active layer 160 may have a SQW (single quantum well) structure.

Further, each of group III nitride compound semiconductor layers, inclusive of the buffer layer, the intermediate layer and the cap layer, for constituting the light-emitting device according to the present invention may be made of quaternary, ternary or binary $Al_xGa_yIn_{1-x-y}N$ ($0 \leq x \leq 1$, $0 \leq y \leq 1$, $0 \leq x+y \leq 1$) of an optional crystal mixture ratio.

Further, a metal nitride compound such as titanium nitride (TiN), hafnium nitride (HfN), or the like, or a metal oxide compound such as zinc oxide (ZnO), magnesium oxide (MgO), manganese oxide (MnO), or the like, other than the aforementioned group III nitride compound semiconductor may be used as the buffer layer.

Further a group II element such as beryllium (Be), zinc (Zn), or the like, other than magnesium (Mg) may be used as the p-type impurities. To reduce the resistance of the p-type semiconductor layer doped with the p-type impurities more greatly, an activating process such as electron beam irradiation, annealing, or the like, may be further carried out.

Although the above embodiments have shown the case where the high carrier density n+ layer 103 is made of gallium nitride (GaN) doped with silicon (Si), these n-type semiconductor layers may be formed by doping the aforementioned group III nitride compound semiconductor with a group IV element such as silicon (Si), germanium (Ge), or the like, or with a group VI element.

Further, silicon carbide (SiC), zinc oxide (ZnO), magnesium oxide (Mgo), manganese oxide (MnO), or the like, other than sapphire may be used as the substrate for crystal growth.

Further, the present invention can be applied to light-receiving devices as well as light-emitting devices.

While the presently preferred embodiment of the present invention has been shown and described, it is to be understood that the disclosure is for the purpose of illustration and that various changes and modification may be made without departing from the scope of the invention as set forth in the appended claims.

What is claimed is:

1. A group III nitride compound semiconductor light-emitting device comprising:

a substrate;

a group III nitride compound semiconductor laminated on said substrate;

a p-type clad layer comprising p-type $Al_xGa_{1-x}N$ ($0<x<1$); and a p-type contact layer comprising p-type $Al_yGa_{1-y}N$ ($0<y<x$) which is lower in a composition ratio of aluminum than said p-type clad layer, said p-type contact layer having a thickness in a range from 200 Å to 1000 Å.

2. A group III nitride compound semiconductor light-emitting device according to claim 1, wherein said p-type contact layer comprises $Al_yGa_{1-y}N$ ($0.1x \leq y \leq 0.7x$).

3. A group III nitride compound semiconductor light-emitting device according to claim 1, wherein said p-type contact layer comprises $Al_yGa_{1-y}N$ ($0.01 \leq y \leq 0.12$).

4. The group III nitride compound semiconductor light-emitting device of claim 1, wherein a metal nitride compound is used as a buffer layer.

5. The group III nitride compound semiconductor light-emitting device of claim 1, wherein a group II element is used as a p-type impurity.

6. The group III nitride compound semiconductor light-emitting device of claim 1, wherein an n-type semiconductor layer may be formed by doping the group III nitride compound semiconductor with a group IV element.

* * * * *